(12) United States Patent
Terao

(10) Patent No.: US 8,654,298 B2
(45) Date of Patent: Feb. 18, 2014

(54) OBLIQUE VAPOR DEPOSITION SUBSTRATE, LIQUID CRYSTAL DEVICE, METHOD FOR MANUFACTURING LIQUID CRYSTAL DEVICE, AND PROJECTION DISPLAY DEVICE

(75) Inventor: Koichi Terao, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 254 days.

(21) Appl. No.: 13/075,352

(22) Filed: Mar. 30, 2011

(65) Prior Publication Data
US 2011/0242447 A1 Oct. 6, 2011

(30) Foreign Application Priority Data

Apr. 1, 2010 (JP) .................................. 2010-084902

(51) Int. Cl.
*G02F 1/1343* (2006.01)
(52) U.S. Cl.
USPC ............................. 349/143; 349/125; 349/145
(58) Field of Classification Search
USPC .................................. 349/125, 143, 145–146
See application file for complete search history.

(56) References Cited

U.S. PATENT DOCUMENTS

| 4,986,637 A * | 1/1991 | Yamaguchi .................... 349/109 |
| 5,146,356 A * | 9/1992 | Carlson ........................... 349/38 |
| 7,263,269 B2 | 8/2007 | Miyashita |
| 2006/0133765 A1* | 6/2006 | Miyashita ..................... 385/147 |
| 2009/0142490 A1 | 6/2009 | Ishida |
| 2010/0007832 A1* | 1/2010 | Sawatari et al. .............. 349/125 |

FOREIGN PATENT DOCUMENTS

| JP | 2006-171566 A | 6/2006 |
| JP | 2006-171567 A | 6/2006 |
| JP | 2008-003405 A | 1/2008 |
| JP | 2009-139497 A | 6/2009 |

* cited by examiner

*Primary Examiner* — Nathanael R Briggs
(74) *Attorney, Agent, or Firm* — ALG Intellectual Property, LLC

(57) ABSTRACT

An oblique vapor deposition substrate having an oblique vapor deposition layer formed thereon is provided, wherein a plurality of pixel sections is arranged in a matrix of intersected straight lines of two directions with each pixel section being spaced apart from each other, and has been relatively rotated in a plane of the oblique vapor deposition substrate taking into consideration the distribution of the vapor deposition directions in the oblique vapor deposition layer.

4 Claims, 13 Drawing Sheets

OBLIQUE VAPOR DEPOSITION SUBSTRATE, LIQUID CRYSTAL DEVICE, METHOD FOR MANUFACTURING LIQUID CRYSTAL DEVICE, AND PROJECTION DISPLAY DEVICE

BACKGROUND

1. Technical Field

The present invention relates to an oblique vapor deposition substrate, a liquid crystal device, a method for manufacturing liquid crystal device, and a projection display device.

2. Related Art

An oblique vapor deposition method for depositing a vapor deposition material on a substrate at an oblique angle is commonly used to form an inorganic alignment layer of a liquid crystal device. The crystals of the vapor deposition material grow at an oblique angle on the substrate surface to form columnar crystalline bodies. The liquid crystal molecules are oriented in the growth direction of the crystalline bodies. If the average orientation of long axes of liquid crystal molecules which are aligned in the plane parallel to the substrate is taken as an easy axis, the easy axis is controlled by the growth direction of crystalline bodies, that is, the direction of the vapor deposition material incident on the substrate (vapor deposition direction).

The vapor deposition material is radially emitted from a vapor deposition source. As a result, the growth directions of crystalline bodies in a substrate plane may vary. Usually, a plurality of liquid crystal devices is simultaneously manufactured using a large oblique vapor deposition substrate which includes a plurality of pixel sections. In this configuration, when an inorganic alignment layer is formed on the oblique vapor deposition substrate, the growth directions of crystalline bodies in the plane of oblique vapor deposition substrate may vary, therefore the easy axes of the respective pixel sections and thus the liquid crystal devices are different.

JP-A-2008-3405 discloses a plurality of pixel sections arranged in an arc shape so that the longitudinal direction of each pixel section is slightly different from that of the adjacent pixel section. With this configuration, even if distributions of vapor deposition directions (variations of easy axes) are generated in the plane of oblique vapor deposition substrate, an easy axis of generally intended direction is obtained in each pixel section separated from the oblique vapor deposition substrate.

According to JP-A-2008-3405, the plurality of pixel sections is irregularly arranged on the oblique vapor deposition substrate. This causes a problem as follows. Usually, when a plurality of panel areas is formed on the oblique vapor deposition substrate, the pixel sections are arranged in a matrix of intersected straight lines of two directions. Therefore, the oblique vapor deposition substrate can be easily cut by forming straight scribe (cutting) lines along the arrangement direction of the pixel sections. However, when a plurality of pixel sections is irregularly arranged as described in JP-A-2008-3405, straight scribe lines can not be formed on the substrate, thereby requiring a special cutting process, leading to a complicated cutting operation.

SUMMARY

An advantage of some aspects of the invention is to provide an oblique vapor deposition substrate in which a variation of alignment between pixel sections can be reduced and the pixel sections can be easily separated from the oblique vapor deposition substrate, a liquid crystal device, a method for manufacturing liquid crystal device and a projection display device.

According to an aspect of the invention, there is provided an oblique vapor deposition substrate having an oblique vapor deposition layer formed thereon, wherein a plurality of pixel sections is arranged in a matrix of intersected straight lines of two directions with each pixel section being spaced apart from each other, and has been relatively rotated in a plane of the oblique vapor deposition substrate taking into consideration the distribution of the vapor deposition directions in the oblique vapor deposition layer.

With this configuration, each of the easy axes to be set generally in the intended direction in the individual pixel sections which are separated from the oblique vapor deposition substrate, even if the vapor deposition directions are distributed (the easy axes vary) in the plane of the oblique vapor deposition substrate. Further, since the panel areas are arranged in a matrix of intersected straight lines of two directions with each pixel section being spaced apart from each other, when scribing the oblique vapor deposition substrate to separate each of the pixel sections, straight pixel scribe lines can be formed along the boundary lines between each of the pixel sections. Accordingly, a special cutting process can be eliminated, thereby facilitating the cutting operation.

In the above aspect of the invention, it is preferable that the pixel section has a rectangular shape, and the plurality of pixel sections includes the pixel sections which have the outline arranged inclined with respect to the two directions. Specifically, it is preferable that the pixel section has a long side direction and a short side direction, and, when each virtual line is set for each pixel section so as to intersect with the long side of the pixel section at a predetermined angle, each of the virtual lines of the pixel sections converge toward a predetermined position which is apart from the oblique vapor deposition substrate.

With this configuration, it is possible to reduce a variation of alignment of easy axes between each of the pixel sections.

In the above aspect of the invention, it is preferable that each of center point of the respective pixel sections are arranged at predetermined intervals in the two directions, and, when one of the two directions which extends along the gaps between the short sides of the pixel sections is defined as a first direction and the other of the two directions which extends along the gaps between the long sides of the pixel sections is defined as a second direction, the center point interval between the pixel sections in the first direction is smaller than the center point interval between the pixel sections in the second direction.

With this configuration, the pixel sections can be positioned in a high density. Accordingly, a number of pixel sections can be separated from one oblique vapor deposition substrate.

According to another aspect of the invention, there is provided a liquid crystal device including a first substrate of a rectangular shape on which an oblique vapor deposition layer is formed, wherein the first substrate includes a first pixel section of a rectangular shape, and the outline of the first substrate and the outline of the first pixel section are arranged inclined with respect to each other.

The first substrate is made of the above mentioned oblique vapor deposition substrate. Therefore, a desired orientation can be easily achieved. Further, since the first substrate can be separated from the oblique vapor deposition substrate with an easy process, the manufacturing cost can be reduced. Accordingly, it is possible to provide a liquid crystal device which is inexpensive and has a high display quality.

It is preferable that the liquid crystal device includes a second substrate of a rectangular shape on which an oblique vapor deposition layer is formed, wherein the second substrate includes a second pixel section of a rectangular shape, the outline of the second substrate and the outline of the second pixel section are arranged inclined with respect to each other, and the first substrate and the second substrate are bonded with the first pixel section and the second pixel section opposing each other.

The second substrate is made of the above mentioned oblique vapor deposition substrate. Therefore, a desired orientation can be easily achieved. Further, since the second substrate can be separated from the oblique vapor deposition substrate with an easy process, the manufacturing cost can be reduced. Accordingly, it is possible to provide a liquid crystal device which is inexpensive and has a high display quality.

According to another aspect of the invention, there is provided a method for manufacturing a liquid crystal device including the steps of forming an oblique vapor deposition layer on a oblique vapor deposition substrate on which a plurality of pixel sections is arranged in a matrix of intersected straight lines of two directions with each pixel section being spaced apart from each other and scribing along boundary lines between each of the plurality of pixel sections in the two directions, wherein the plurality of pixel sections has been relatively rotated in a plane of the oblique vapor deposition substrate taking into consideration the distribution of the vapor deposition directions in the oblique vapor deposition layer.

With this configuration, each of the easy axes to be set generally in the intended direction in the individual pixel sections which are separated from the oblique vapor deposition substrate, even if the vapor deposition directions are distributed (the easy axes vary) in the plane of the oblique vapor deposition substrate. Further, since the panel areas are arranged in a matrix of intersected straight lines of two directions with each pixel section being spaced apart from each other, when scribing the oblique vapor deposition substrate to separate each of the pixel sections, straight pixel scribe lines can be formed along the boundary lines between each of the pixel sections. Accordingly, a special cutting process can be eliminated, thereby facilitating the cutting operation.

According to another aspect of the invention, there is provided a projection display device that uses a liquid crystal light valve which is composed of the above mentioned liquid crystal device housed in a mounting case as light modulation means, wherein the liquid crystal device includes the first substrate, a second substrate arranged so as to oppose the first substrate with a liquid crystal being disposed therebetween and a dust proof substrate disposed on the side of the second substrate opposite to that on which the liquid crystal is placed, the dust proof substrate has a rectangular shape, the outline of the dust proof substrate is arranged parallel to the outline of the first pixel section of the first substrate, the mounting case includes a frame unit having a recessed shape in which the dust proof substrate is fit, the frame unit includes a window on the side which opposes the first pixel section to allow light to pass therethrough into the first pixel section.

With this configuration, a misalignment between the window of the mounting case and the first pixel section of the liquid crystal device can be reduced, even if the liquid crystal device is used in which the outline of the first pixel sections and the outline of the first substrate are not arranged parallel to each other.

BRIEF DESCRIPTION OF THE DRAWINGS

The invention will be described with reference to the accompanying drawings, wherein like numbers reference like elements.

DESCRIPTION OF EXEMPLARY EMBODIMENTS

Oblique Vapor Deposition Substrate-1

Figure 1:
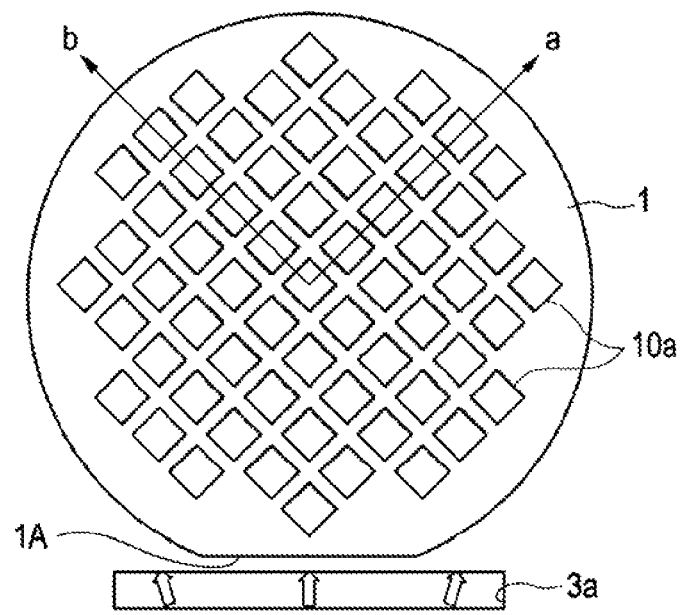
FIG. 1 is a plan view of an oblique vapor deposition substrate according to a first embodiment.

FIG. 1 is a plan view of an oblique vapor deposition substrate according to a first embodiment.

An oblique vapor deposition substrate 1 is a circular wafer made of a glass substrate or a monocrystalline silicon substrate. On the surface of the oblique vapor deposition substrate 1, pixel sections 10a to be used for a plurality of liquid crystal devices are formed. In each pixel section 10a, a plurality of pixels including pixel electrodes and pixel switching elements is formed. A plurality of (in FIG. 1, sixty-one) pixel sections 10a each having a size on the order of 1 inch is arranged in straight rows and columns intersecting in a first direction a and a second direction b on the surface of the oblique vapor deposition substrate 1 with each pixel section being spaced apart from each other. The first direction a and the second direction b are, for example, inclined at 45° clockwise and counterclockwise, respectively, with respect to a direction perpendicular to an orientation flat 1A.

Figure 2:
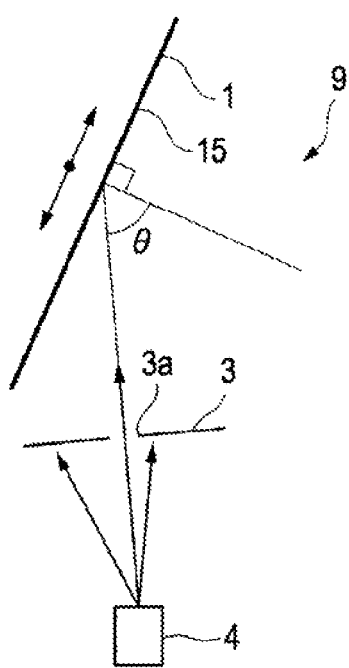
FIG. 2 is a schematic configuration view of a vapor deposition device that forms an oblique vapor deposition layer on the oblique vapor deposition substrate.

An inorganic alignment layer 15 is formed on the surface of the oblique vapor deposition substrate 1 using a vapor deposition device 9 which is shown in FIG. 2. The inorganic alignment layer 15 is an oblique vapor deposition layer on which a vapor deposition material grows by crystal growth in an oblique direction with respect to the oblique vapor deposition substrate 1. The vapor deposition device 9 includes a vapor deposition source 4 that contains a material, such as silicon oxide, for forming an inorganic alignment layer. A shield plate 3 is placed between the vapor deposition source 4 and the oblique vapor deposition substrate 1. When the vapor deposition material is emitted from the vapor deposition source 4, the shield plate 3 allows only the vapor deposition material that is incident at a predetermined angle θ with respect to a normal of the oblique vapor deposition substrate 1 to be selectively vapor deposited. The shield plate 3 has a strip-shaped slit 3a that permits only the vapor deposition material passing through the slit 3a to reach the oblique vapor deposition substrate 1. The oblique vapor deposition substrate 1 is transported in a direction perpendicular to a longitudinal direction of the slit 3a such that the inorganic alignment layer 15 is formed throughout the oblique vapor deposition substrate 1.

As shown in FIG. 1, the longitudinal direction of the slit 3a is parallel to the orientation flat 1A. Since the vapor deposition material is emitted and radiated from the vapor deposition source 4, the vapor deposition direction of the vapor deposition material (the direction in the plane parallel to the oblique vapor deposition substrate 1) are different depending on the position the material passes through in the slit 3a. For example, when the vapor deposition material passes through the left side of the slit 3a, the vapor deposition direction is inclined at a predetermined angle counterclockwise with respect to the direction perpendicular to the orientation flat 1A. On the other hand, when the vapor deposition material passes through the right side of the slit 3a, the vapor deposition direction is inclined at a predetermined angle clockwise with respect to the direction perpendicular to the orientation flat 1A.

The vapor deposition material deposited on the oblique vapor deposition substrate 1 grows by crystal growth in an oblique direction with respect to the normal of the oblique vapor deposition substrate 1. Then, a number of columnar crystalline bodies grown by crystal growth in the oblique direction forms the inorganic alignment layer 15. The inorganic alignment layer 15 makes the liquid crystal molecules to be oriented in the growth direction of the columnar crystalline bodies. Since the vapor deposition directions of the vapor deposition material are different (distributed) on the oblique vapor deposition substrate 1, the directions of orientation of the liquid crystal molecules are also different on the oblique vapor deposition substrate 1. As a result, if the average orientation of long axes of liquid crystal molecules which are aligned by the inorganic alignment layer 15 is taken as an easy axis, different easy axes are generated by different positions on the oblique vapor deposition substrate 1.

Since a plurality of pixel sections 10a is formed on the oblique vapor deposition substrate 1, different pixel sections 10a have different easy axes. Although the easy axis within one pixel section 10a continuously changes in a strict sense, the variation of easy axis is insignificant because the each pixel section 10a has a size on the order of 1 inch at most. The problem is a distribution of different easy axes of respective pixel sections 10a. In the oblique vapor deposition substrate 1 according to this embodiment, this problem is solved as described below.

Figure 3:
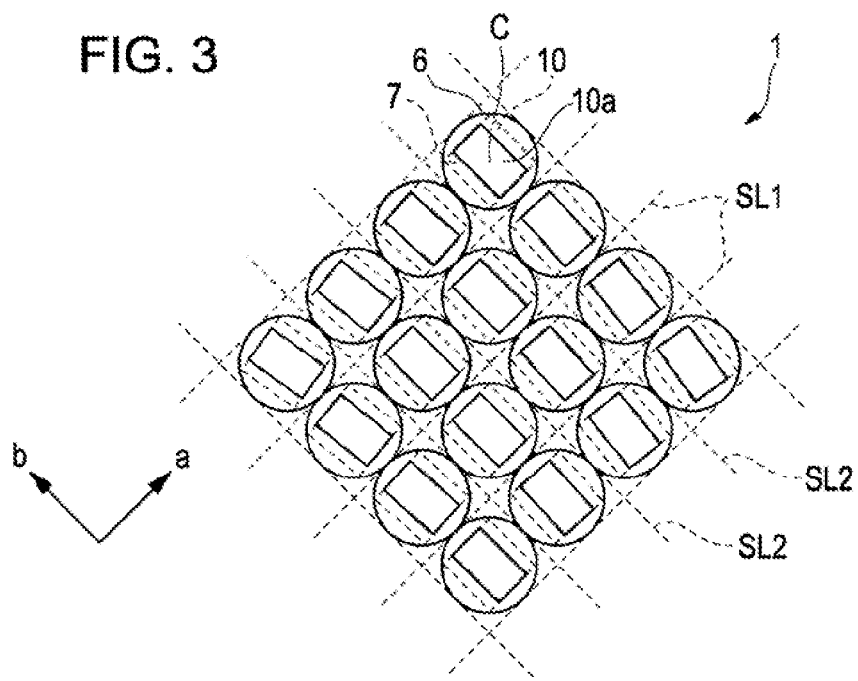
FIG. 3 is an enlarged plan view of a portion of pixel sections on the oblique vapor deposition substrate.

FIG. 3 is an enlarged plan view of a portion of pixel sections 10a on the oblique vapor deposition substrate 1. In FIG. 3, reference numerals SL 1 and SL 2 denote scribe lines and reference numeral 10 denotes a panel area. Reference numeral 7 denotes a minimum square that enclose the pixel sections 10a, which is shown by the virtual line, while reference numeral 6 denotes a minimum circumscribed circle of the square 7, which is shown by the virtual line which is shown by the virtual line which is shown by the virtual line.

A plurality of panel areas 10 having the respective pixel sections 10a is arranged in straight rows and columns in a first direction a and a second direction b on the oblique vapor deposition substrate 1 with each panel area 10 being spaced apart from each other. The pixel section 10a has a rectangular shape having a long side direction and a short side direction. The first direction a is defined as a direction extending along the gaps between the short sides of the pixel sections 10a and the second direction b is defined as a direction extending along the gaps between the long sides of the pixel sections 10a. Accordingly, each of the center point of the respective pixel sections 10a (intersection point of the diagonal lines of the respective pixel sections 10a) C are arranged at predetermined intervals both in the first direction a and the second direction b.

The scribe lines SL 1 extend parallel to the first direction a along the gaps between the short sides of the pixel sections 10a. The scribe lines SL 2 extend parallel to the second direction b along the gaps between the long sides of the pixel sections 10a. Then, the oblique vapor deposition substrate 1 is cut along the scribe lines SL 1 and SL 2, thereby separating individual panel areas 10. Each panel area 10 is used as one of substrates in a small liquid crystal device such as liquid crystal light valve.

In the oblique vapor deposition substrate 1, the plurality of pixel sections 10a has been relatively rotated in a plane of the oblique vapor deposition substrate 1 taking into consideration the distribution of the vapor deposition directions in the oblique vapor deposition layer. Although the outline (the long sides and short sides) of the respective pixel sections 10a are arranged generally parallel to the first direction a and the second direction b, at least some of the plurality of pixel sections 10a have the outline which is inclined with respect to the first direction a and the second direction b in order to optimize the vapor deposition directions of the vapor deposition material for each pixel section 10a.

Figure 4:
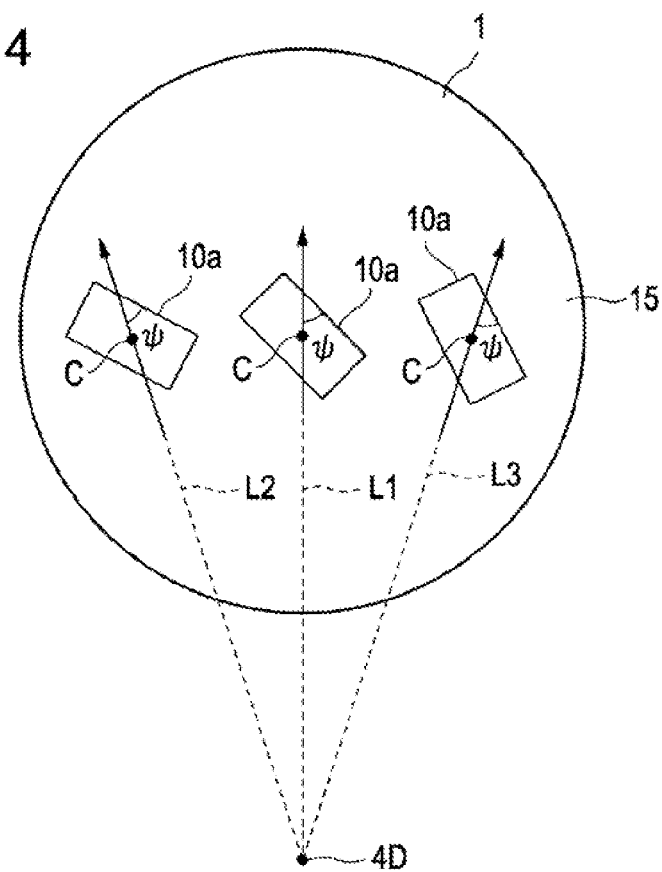
FIG. 4 is a view showing a relationship between the positions of a pixel sections and a rotation amount of the pixel sections.

FIG. 4 is a view showing a relationship between the positions of the pixel sections 10a and a rotation amount of the pixel sections 10a.

As described above, the columnar crystalline bodies on the inorganic alignment layer 15 grow in the vapor deposition direction of the vapor deposition material. The easy axis corresponds to the direction in which the vapor deposition direction of the vapor deposition material is projected to the plane parallel to the oblique vapor deposition substrate 1. Accordingly, the easy axis extends toward a position 4D where the vapor deposition source is projected to the plane parallel to the oblique vapor deposition substrate 1.

In order to optimize the easy axis for each pixel section 10a, the outline of the pixel section 10a may be rotated at a predetermined angle on the plane parallel to the oblique vapor deposition substrate 1 so as to correspond with the easy axis.

For example, if the easy axis is set to the direction inclined at an angle φ with respect to the long side of the pixel section 10a, the outline of the pixel section 10a may be rotated so that the virtual line L1, L2, L3 (a line parallel to the easy axis) that connects the center point C of the pixel section 10a and the position 4D intersects with the long side of the pixel sections 10a at an angle φ.

In the oblique vapor deposition substrate 1 according to this embodiment, when each virtual line L1, L2 and L3 is set for each pixel section 10a so as to intersect with the long side of the pixel section 10a at an angle φ, each of the virtual lines L1, L2 and L3 of the pixel sections 10a converge toward the predetermined position 4D which is apart from the oblique vapor deposition substrate 1. Each virtual line L1, L2 and L3 is a line parallel to the easy axis of the pixel section 10a. The position 4D where the virtual lines L1, L2 and L3 converge corresponds to a position of the vapor deposition source. When the vapor deposition source is regarded as a point source, the virtual lines L1, L2 and L3 that extend through the center point C of the pixel sections 10a converge generally at one point. This allows each of the easy axes to be set generally in the intended direction in the individual pixel sections 10a which are separated from the oblique vapor deposition substrate 1, even if the easy axes varies in the plane of the oblique vapor deposition substrate 1.

Returning to FIG. 3, the plurality of pixel sections 10a has been relatively rotated in the plane of the oblique vapor deposition substrate 1 taking the distribution of the vapor deposition directions of the oblique vapor deposition layer. When the intervals between the pixel sections 10a are narrow, the pixel sections 10a may interfere with each other. Therefore, the plurality of pixel sections 10a is arranged in the following manner. First, the minimum square 7 is virtually defined to inscribe the pixel sections 10a. Then, the minimum circle 6 is virtually defined to circumscribe the square 7. Further, a center point of the circle 6 is defined as a center point C of the pixel section 10a, and the pixel sections 10a are arranged both in the first direction a and the second direction b so that the circles 6 are not superposed on each other. The rotation amount of the pixel section 10a on the oblique vapor deposition substrate 1 is adjusted by allowing the square 7 to rotate about the center point C while inscribing the circle 6. As a result, the pixel sections 10a can be arranged in high density in an orderly manner while preventing the pixel sections 10a from interfering with each other.

Figure 5:
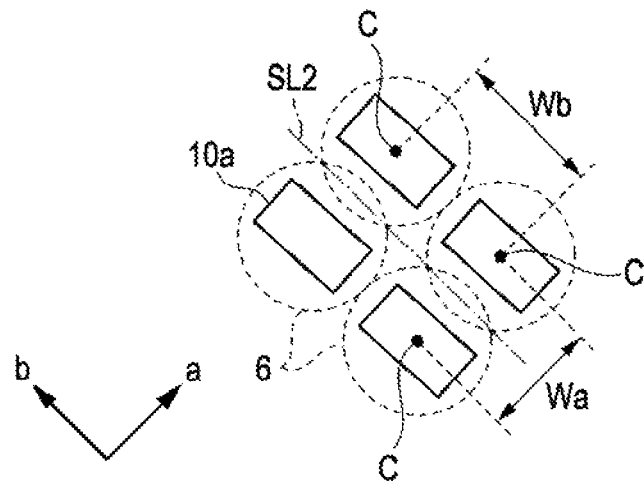
FIG. 5 is a plan view showing an alternative arrangement of pixel sections.

Although the circles 6 are arranged so as not to be superposed on each other in FIG. 3, the circles 6 are not limited to this configuration. For example, as shown in FIG. 5, the circles 6 may be superposed in part in the first direction a, so that a center interval Wa of the pixel sections 10a in the first direction a is smaller than a center interval Wb of the pixel sections 10a in the second direction b. In FIG. 3, a position interval between the pixel sections 10a in the first direction a (the direction generally parallel to the short side) is equal to a position interval between the pixel sections 10a in the second direction b (the direction generally parallel to the long side). The first direction a is a direction generally parallel to the short side direction of the pixel section 10a, therefore the interval between the pixel sections 10a in the first direction a may be excessively wide. Therefore, as shown in FIG. 5, the position interval Wa between the pixel sections 10a in the first direction a can be reduced so as to increase a density of the positions of the pixel section 10a in the first direction.

Although the scribe line SL 2 is set at the center of the superposed region of the circles 6 in FIG. 5, the scribe line SL 2 is not limited to this configuration. The scribe line SL 2 may be offset along the first direction a. This makes it possible to freely change the positions of the pixel section 10a within the panel area when the oblique vapor deposition substrate 1 is cut by each panel area.

Although only the position interval Wa in the first direction is reduced in FIG. 5, the position interval Wb in the second direction b may also be reduced. That is, the circles 6 may be superposed in part both in the first direction a and the second direction b, so that both the center interval Wa of the pixel sections 10a in the first direction a and the center interval Wb of the pixel sections 10a in the second direction b are smaller than a radius of the circle 6. This makes it possible to minimize the wasted area around the pixel section 10a.

Oblique Vapor Deposition Substrate-2

Figure 6:
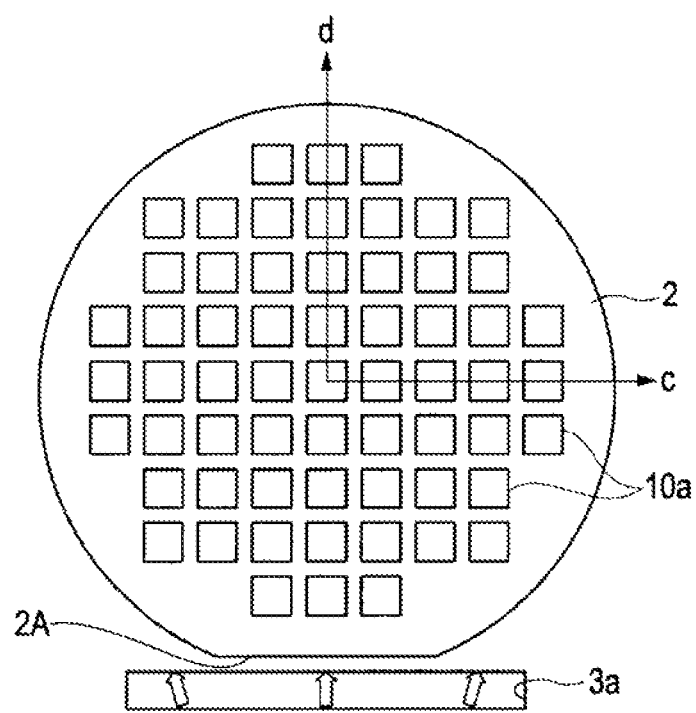
FIG. 6 is a plan view of an oblique vapor deposition substrate according to a second embodiment.

FIG. 6 is a plan view of an oblique vapor deposition substrate according to a second embodiment. In an oblique vapor deposition substrate 2 of this embodiment, the same reference numerals are used for the same configuration as that of the oblique vapor deposition substrate 1 of the first embodiment in order to avoid duplicated explanation.

An oblique vapor deposition substrate 2 is a circular wafer made of a glass substrate or a monocrystalline silicon substrate. On the surface of the oblique vapor deposition substrate 2, pixel sections 10a to be used for a plurality of liquid crystal devices are formed. In each pixel section 10a, a plurality of pixels is formed including pixel electrodes and pixel switching elements. A plurality of (in FIG. 6, sixty-one) pixel sections 10a each having a size on the order of 1 inch is arranged in straight rows and columns intersecting in a first direction c and a second direction d on the surface of the oblique vapor deposition substrate 2 with each pixel section being spaced apart from each other. The first direction c and the second direction d are, for example, inclined at angles of 0° and 90°, respectively, with respect to a direction perpendicular to an orientation flat 2A.

An inorganic alignment layer is formed on the surface of the oblique vapor deposition substrate 2 using a vapor deposition device 9 which is shown in FIG. 2. A slit 3a of the vapor deposition device has the longitudinal direction in the direction parallel to the orientation flat 2A. Since the vapor deposition material is emitted and radiated from the vapor deposition source, the vapor deposition direction of the vapor deposition material (the direction in the plane parallel to the oblique vapor deposition substrate 2) are different depending on the position the material passes through in the slit 3a. For example, when the vapor deposition material passes through the left side of the slit 3a, the vapor deposition direction is inclined at a predetermined angle counterclockwise with respect to the direction perpendicular to the orientation flat 2A. On the other hand, when the vapor deposition material passes through the right side of the slit 3a, the vapor deposition direction is inclined at a predetermined angle clockwise with respect to the direction perpendicular to the orientation flat 2A.

The pixel section 10a has a rectangular shape having a long side direction and a short side direction. The first direction c is defined as a direction extending along the gaps between the short sides of the pixel sections 10a and the second direction d is defined as a direction extending along the gaps between the long sides of the pixel sections 10a. Accordingly, each of the center point of the respective pixel sections 10a (intersection point of the diagonal lines of the pixel sections 10a) are arranged at predetermined intervals both in the first direction c and the second direction d.

The scribe lines c and d, which are not shown, are formed on the oblique vapor deposition substrate 2 so as to extend in the directions c and d along the gaps between the short sides and long sides of the pixel sections 10a, respectively. Then, the oblique vapor deposition substrate 2 is cut along the scribe lines, thereby separating individual panel areas. Each panel area is used as one of substrates in a small liquid crystal device such as liquid crystal light valve.

In the oblique vapor deposition substrate 2, the plurality of pixel sections 10*a* has been relatively rotated in the plane of the oblique vapor deposition substrate 2 taking into consideration the distribution of the vapor deposition directions in the oblique vapor deposition layer. Although each of the outline (the long sides and short sides) of the pixel sections 10*a* are arranged generally parallel to the first direction c and the second direction d, at least some of the plurality of pixel sections 10*a* have the outline which is inclined with respect to the first direction c and the second direction d in order to optimize the vapor deposition directions of the vapor deposition material for each pixel section 10*a*.

Figure 7:
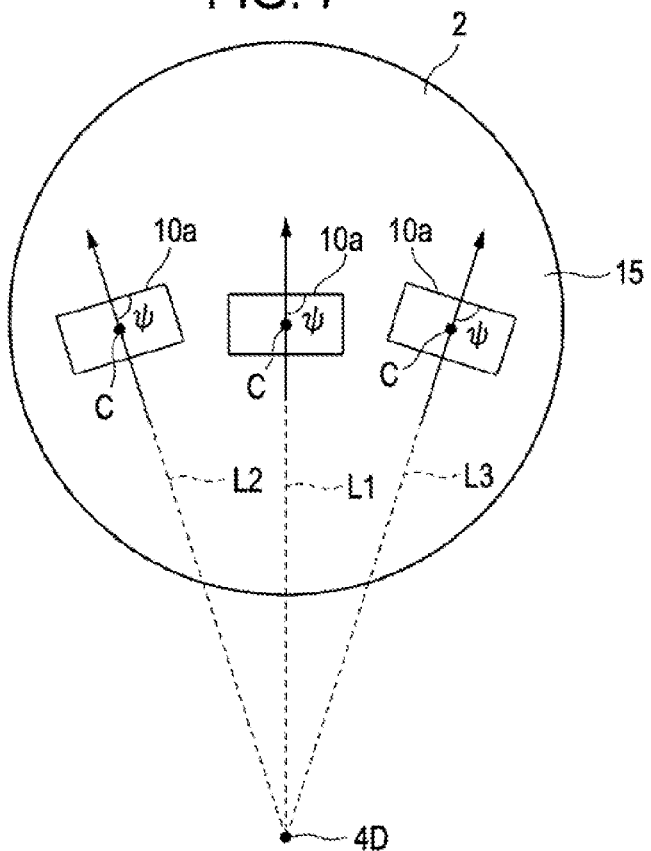
FIG. 7 is a view showing a relationship between the positions of a pixel sections and a rotation amount of the pixel sections.

FIG. 7 is a view showing a relationship between the positions of the pixel sections 10*a* and a rotation amount of the pixel sections 10*a*.

As described above, the columnar crystalline bodies on the inorganic alignment layer 15 grow in the vapor deposition direction of the vapor deposition material. The easy axis corresponds to the direction in which the vapor deposition direction of the vapor deposition material is projected to the plane parallel to the oblique vapor deposition substrate 2. Accordingly, the easy axis extends toward a position 4D where the vapor deposition source is projected to the plane parallel to the oblique vapor deposition substrate 2.

In order to optimize the easy axis for each pixel section 10*a*, the outline of the pixel section 10*a* may be rotated at a predetermined angle on the plane parallel to the oblique vapor deposition substrate 2 so as to correspond with the easy axis. For example, if the easy axis is set to the direction inclined at an angle $\phi$ with respect to the long side of the pixel section 10*a*, the outline of the pixel section 10*a* may be rotated so that the virtual line L1, L2, L3 (a line parallel to the easy axis) that connects the center point C of the pixel section 10*a* and the position 4D intersects with the long side of the pixel sections 10*a* at an angle $\phi$.

In the oblique vapor deposition substrate 2 according to this embodiment, when each virtual line L1, L2 and L3 is set for each pixel section 10*a* so as to intersect with the long side of the pixel section 10*a* at an angle $\phi$, each of the virtual lines L1, L2 and L3 of the pixel sections 10*a* converge toward the predetermined position 4D which is apart from the oblique vapor deposition substrate 2. Each virtual line L1, L2 and L3 is a line parallel to the easy axis of the pixel section 10*a*. The position 4D where the virtual lines L1, L2 and L3 converge corresponds to a position of the vapor deposition source. When the vapor deposition source is regarded as a point source, the virtual lines L1, L2 and L3 that extend through the center point C of the pixel sections 10*a* converge generally at one point. This allows each of the easy axes to be set generally in the intended direction in the individual pixel sections 10*a* which are separated from the oblique vapor deposition substrate 2, even if the easy axes varies in the plane of the oblique vapor deposition substrate 2.

Panel Area

Figure 8:
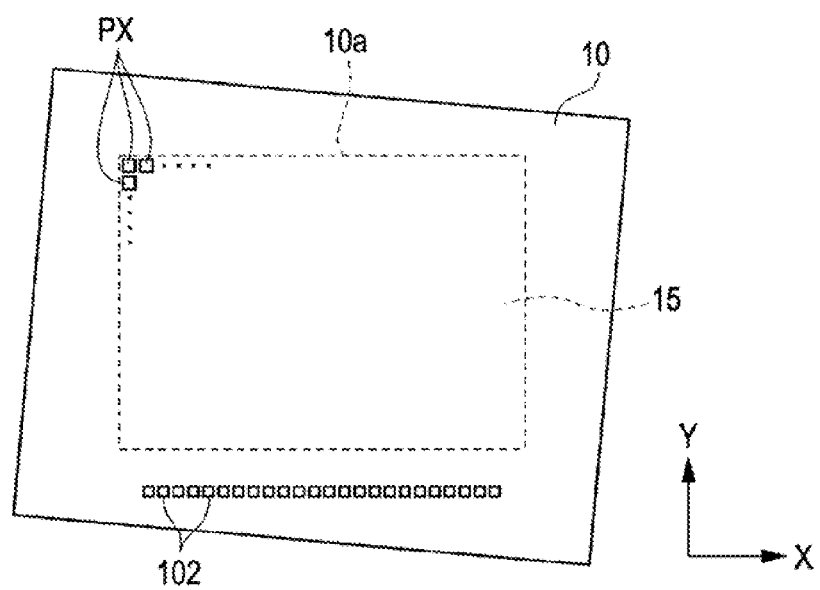
FIG. 8 is a plan view of an example of a panel area which is separated from the oblique vapor deposition substrate.

FIG. 8 is a plan view of an example of the panel area 10 which is separated from the oblique vapor deposition substrate.

The pixel section 10*a* is formed in the center of the panel area 10. In pixel section 10*a*, a plurality of pixels PX is arranged in a matrix of the X direction and the Y direction. Each pixel PX is provided with pixel electrodes and pixel switching elements (such as TFT). A plurality of external circuit connecting terminals 102 is disposed along the long side of the pixel section 10*a*. The external circuit connecting terminals 102 are connected to the pixels PX via lines (not shown) which are formed simultaneously with the pixel sections 10*a*.

The panel area 10 is used as one of substrates in a small liquid crystal device such as liquid crystal light valve. An example of the panel area 10 used as a TFT array substrate 10 in a transmissive liquid crystal light valve will be described below. In the following description, two perpendicular directions in a plane parallel to the TFT array substrate 10 are referred to as X direction and Y direction, and a direction perpendicular to the X direction and the Y direction is referred to as Z direction. The X direction is parallel to the long side of the pixel section 10*a*, while the Y direction is parallel to the short side of the pixel section 10*a*.

Liquid Crystal Device-1

Figure 9:
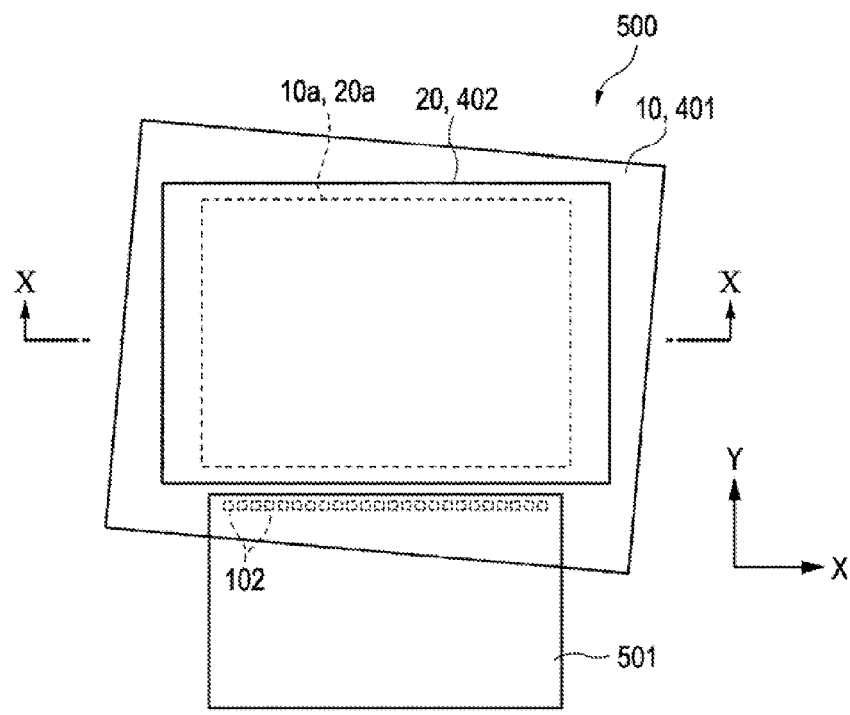
FIG. 9 is a plan view of a liquid crystal device with a TFT array substrate according to the first embodiment.
Figure 10:
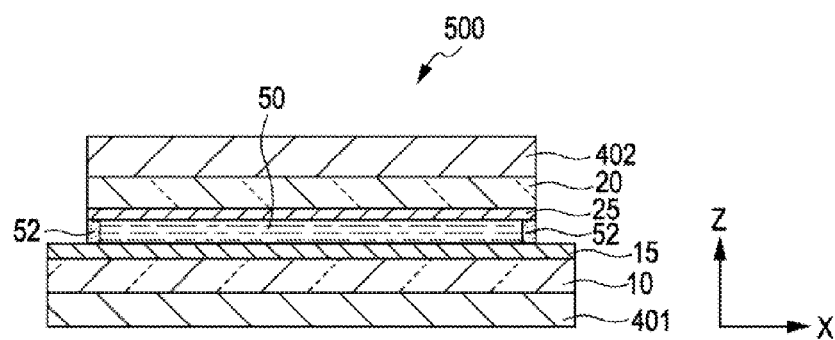
FIG. 10 is a sectional view taken along the line X-X of FIG. 9.

FIG. 9 is a plan view of a liquid crystal device with a TFT array substrate 10 according to the first embodiment. FIG. 10 is a sectional view taken along the line X-X of FIG. 9.

A liquid crystal device 500 includes the TFT array substrate 10 and an opposite substrate 20 which are arranged so as to oppose each other. The liquid crystal device 500 is a transmissive liquid crystal device in which a light transmissive substrates such as glass substrate are used for the TFT array substrate 10 and the opposite substrate 20. The TFT array substrate 10 and the opposite substrate 20 are bonded by the seal material 52 which is disposed at the peripheries on their opposing surfaces in a form of a rectangular frame. A liquid crystal 50 is sealed in an area enclosed by the TFT array substrate 10, the opposite substrate 20 and the seal material 52.

The pixel section (a first pixel section) 10*a*, in which a plurality of pixels PX including pixel electrodes is arranged in a matrix of the X direction and the Y direction, is provided in the center of the TFT array substrate 10. The outline of the pixel section 10*a* is defined by the outline of the pixel electrodes located at the outermost part of the pixel section 10*a*. The outline of the pixel section 10*a* formed by the outline of the pixel electrodes located at the outermost part of the pixel section 10*a* has a rectangular shape having a longitudinal direction in the X direction. In the pixel section 10*a*, the plurality of pixels PX including pixel electrodes is arranged in a matrix along the long side of the pixel section 10*a* (X direction) and the short side of the pixel section 10*a* (Y direction).

A pixel section (a second pixel section) 20*a*, in which a shielding layer is formed in the X direction and the Y direction so as to oppose the gaps between the pixel electrodes, is provided in the center of the opposite substrate 20. The outline of the pixel section 20*a* is defined by the outline of the shielding layer located at the outermost part of the pixel section 20*a*. The outline of the pixel section 20*a* formed by the outline of the shielding layer located at the outermost part of the pixel section 20*a* has a rectangular shape having a longitudinal direction in the X direction. On the pixel section 20*a*, the shielding layer is provided in a grid along the long side of the pixel section 20*a* (X direction) and the short side of the pixel section 20*a* (Y direction). The outline shapes of the pixel section 10*a* and the pixel section 20*a* generally conform with each other. The TFT array substrate 10 and the opposite substrate 20 are bonded with the pixel section 10*a* and the pixel sections 20*a* opposing each other.

A plurality of external circuit connecting terminals 102 is arranged along one side of the pixel section 10*a* around the area in which the TFT array substrate 10 and the opposite substrate 20 oppose each other. The external circuit connecting terminals 102 are connected to a FPC (flexible print circuit) 501.

The TFT array substrate 10 and the opposite substrate 20 each have a rectangular shape having a long side direction and a short direction. The long side and the short side of the TFT array substrate 10 are arranged inclined with respect to the long side and the short side of the pixel section 10a at several degrees, respectively. The long side and the short side of the opposite substrate 20 are arranged parallel to the long side and the short side of the pixel section 10a, respectively.

The alignment layer 15 is disposed on the side of the TFT array substrate 10 which faces a liquid crystal 50, while an alignment layer 25 is disposed on the side of the opposite substrate 20 which faces the liquid crystal 50. The alignment layer 15 and the alignment layer 25 are inorganic alignment layers formed by oblique vapor deposition of an inorganic material such as silicon oxide. The directions of the easy axis of the alignment layer 15 and the easy axis of the alignment layer 25 are determined depending on the display type (such as VA type and IPS type) used in the liquid crystal device 500.

A first dust proof substrate 401 is disposed on the side of the TFT array substrate 10 opposite to that on which the liquid crystal 50 is placed. A second dust proof substrate 402 is disposed on the side of the opposite substrate 20 opposite to that on which the liquid crystal 50 is placed. The first dust proof substrate 401 is formed of the same material and in the same size as the TFT array substrate 10 and arranged so as to superpose the TFT array substrate 10 in exactly the same shape as seen from the Z direction. The second dust proof substrate 402 is formed of the same material and in the same size as the opposite substrate 20 and arranged so as to superpose the opposite substrate 20 in exactly the same shape as seen from the Z direction.

Figure 11:
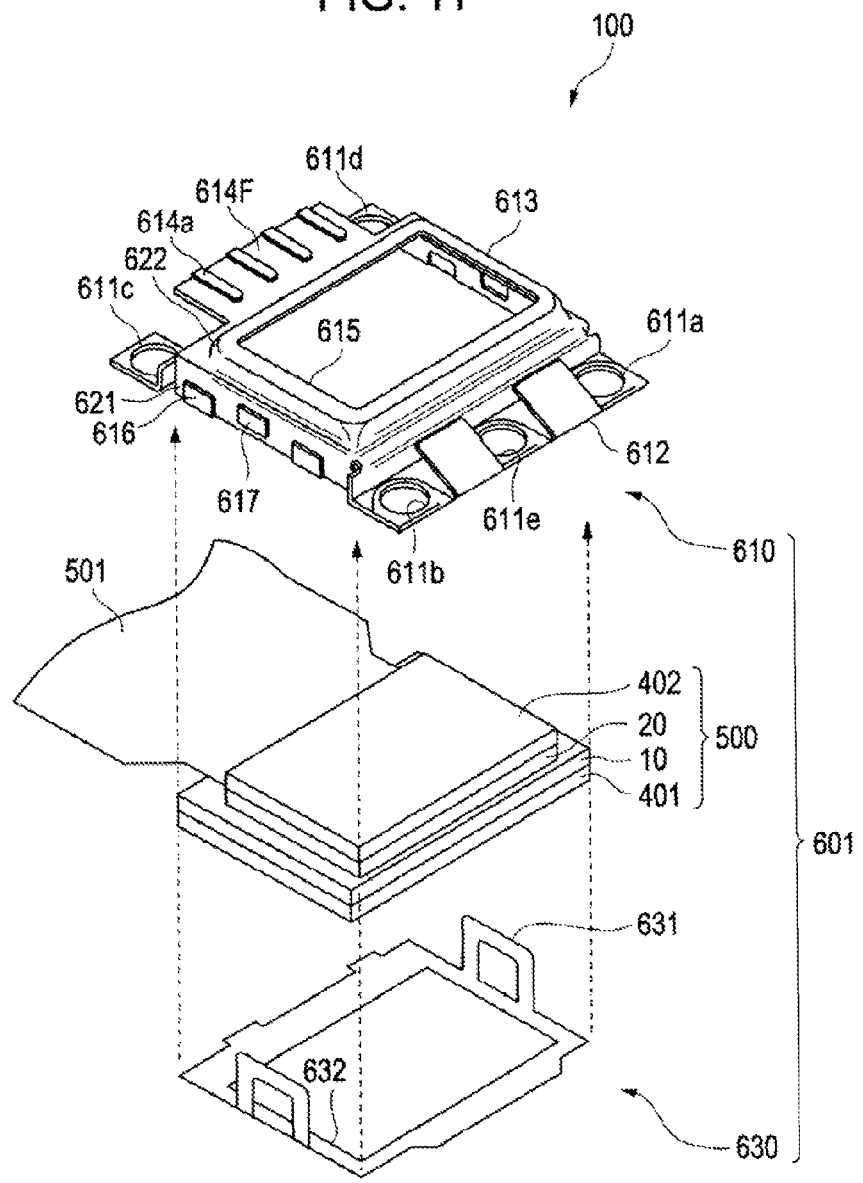
FIG. 11 is an exploded perspective view of a liquid crystal light valve including the liquid crystal device and a mounting case.
Figure 12:
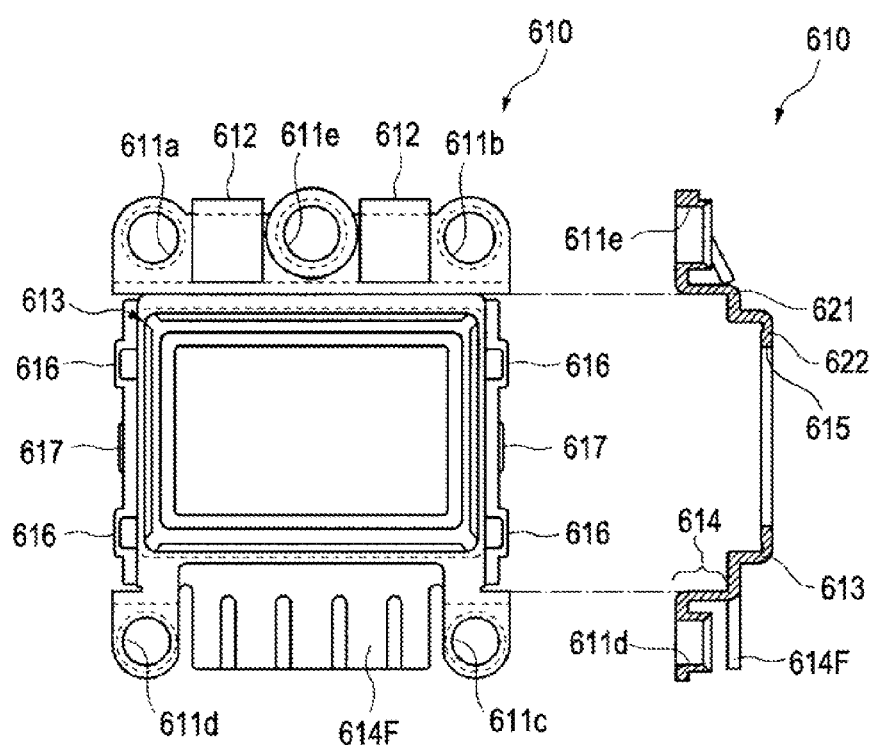
FIG. 12 are a plan view and a sectional view of the mounting case.

FIG. 11 is an exploded perspective view of a liquid crystal light valve 100 including the liquid crystal device 500 and a mounting case for mounting the liquid crystal device 500 therein. FIG. 12 are a plan view and a sectional view of the mounting case.

A mounting case 601 is composed of a frame 610 that houses the liquid crystal device 500 and a cover member 630 that covers the frame 610. The cover member 630 is assembled to the frame 610 by engaging hooks 631 formed at the ends thereof and claws 617 formed on the sides of the frame 610. The liquid crystal device 500 is mounted such that the side thereof where the opposite substrate 20 is disposed faces the frame 610 and the outer surface of the side thereof where the TFT array substrate 10 is disposed is covered with the cover member 630. The liquid crystal light valve 100 is configured such that light is incident from the side of the frame 610, passes through the liquid crystal device 500 and exits from the side of the cover member 630.

The cover member 630 includes a frame shaped body in which a window 632 is opened and the hooks 631 formed at both ends of the body. The window 632 opposes the pixel sections and is opened to allow light from the pixel sections of the liquid crystal device 500 to be emitted therethrough.

The frame 610 includes a body 613 that houses the liquid crystal device 500, mounting holes 611a to 611e for mounting the liquid crystal light valve 100 on a housing of the liquid crystal projector, air guide members 612 for cooling and a vane 614F for heat dissipation.

The body 613 includes a first frame unit 621 that houses the TFT array substrate 10 and the first dust proof substrate 401 and a second frame unit 622 that houses the opposite substrate 20 and the second dust proof substrate 402. The body 613 further includes a window 615 formed in the top surface of the second frame unit 622 and guide sections 616 and claws 617 formed on sides of the first frame unit 621. The window 615 opposes the pixel sections and is opened to allow light to pass therethrough into the pixel sections of the liquid crystal device 500 housed in the body 613. The claw 617 is provided so as to be engaged by the hook 631. The guide section 616 is formed such that a stepped portion thereof on the side of the claw 617 works to guide the hook 631 to the claw 617. The FPC 501 is led out of the mounting case 601 through an opening 614 which is formed on a side of the first frame unit 621.

Figure 13:
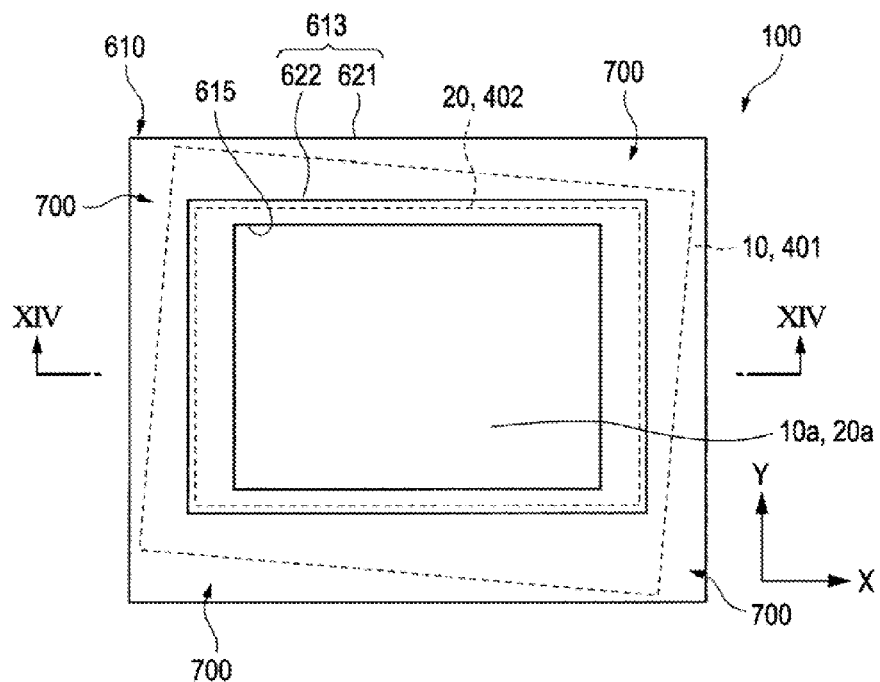
FIG. 13 is a view showing a positional relationship between a frame and the liquid crystal device.
Figure 14:
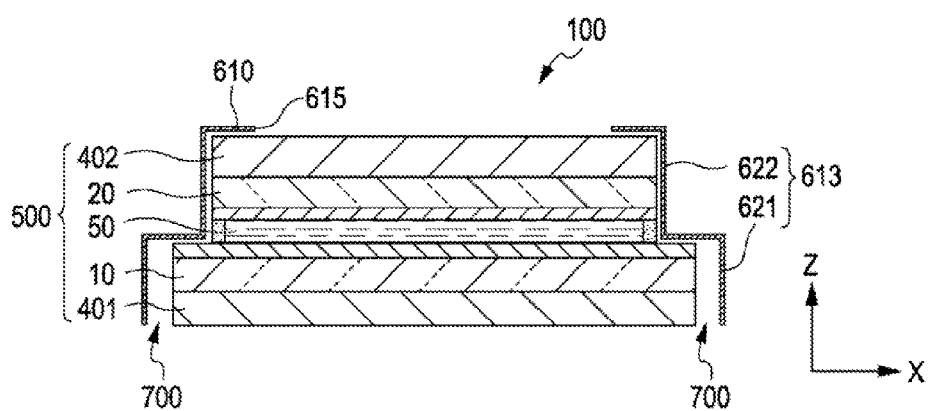
FIG. 14 is a sectional view taken along the line XIV-XIV of FIG. 13.

FIG. 13 is a view showing a positional relationship between the frame 610 and the liquid crystal device 500. FIG. 14 is a sectional view taken along the line XIII-XIII of FIG. 13. In FIGS. 13 and 14, only essential components are shown and additional components such as FPC are not shown for clarity of explanation.

The long side and the short side of the first frame unit 621 and the second frame unit 622 are arranged parallel to the long side and the short side, respectively, of the pixel sections 10a and 20a of the liquid crystal device 500. The long side and the short side of the opposite substrate 20 and the second dust proof substrate 402 of the liquid crystal device 500 are arranged parallel to the long side and the short side, respectively, of the pixel sections 10a and 20a, while the long side and the short side of the TFT array substrate 10 and the first dust proof substrate 401 of the liquid crystal device 500 are arranged inclined with respect to the long side and the short side, respectively, of the pixel sections 10a and 20a.

The first frame unit 621 is formed to be larger than the TFT array substrate 10 and the first dust proof substrate 401 such that a gap 700 is formed between a side of the first frame unit 621 and a side of each of the TFT array substrate 10 and the first dust proof substrate 401. The second frame unit 622 is formed to be substantially the same shape and size as the opposite substrate 20 and the second dust proof substrate 402 such that little gap is formed between a side of the second frame unit 622 and a side of each of the opposite substrate 20 and the second dust proof substrate 402. The second frame unit 622 has a recess so as to allow the opposite substrate 20 and the second dust proof substrate 402 to be snugly fit within the recess. The liquid crystal device 500 is secured to the frame 610 by fitting the opposite substrate 20 and the second dust proof substrate 402 into the second frame unit 622. Accordingly, the positioning between the pixel sections 10a and 20a and the window 615 is achieved.

Liquid Crystal Device-2

Figure 15:
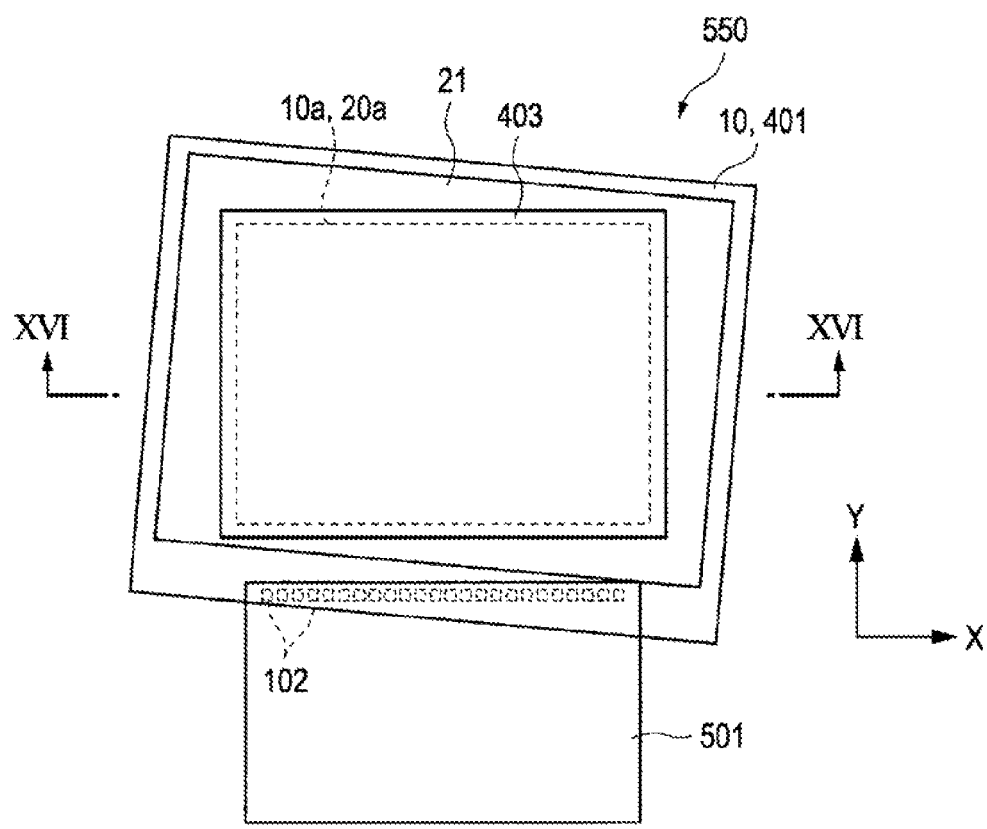
FIG. 15 is a plan view of a liquid crystal device with a TFT array substrate according to a second embodiment.
Figure 16:
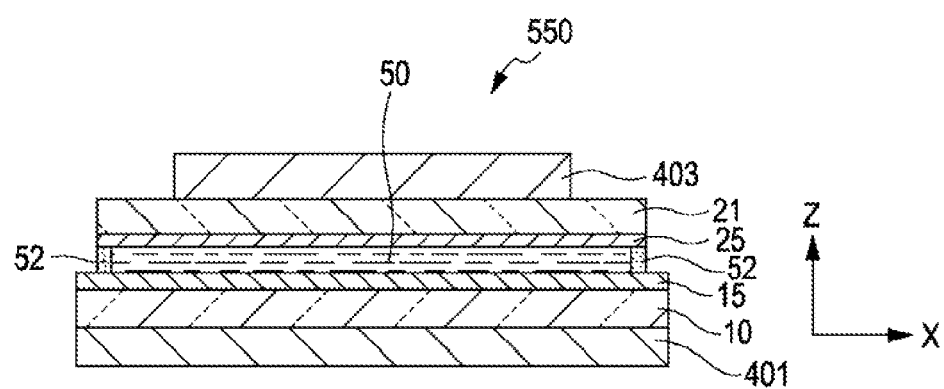
FIG. 16 is a sectional view taken along the line XVI-XVI of FIG. 15.

FIG. 15 is a plan view of a liquid crystal device with a TFT array substrate 10 according to a second embodiment. FIG. 16 is a sectional view taken along the line XVI-XVI of FIG. 15. In a liquid crystal device 550 of this embodiment, the same reference numerals are used for the same configuration as that of the liquid crystal device 500 of the first embodiment in order to avoid duplicated explanation.

A liquid crystal device 550 includes the TFT array substrate 10 and the opposite substrate 21 which are arranged so as to oppose each other. The pixel section (a first pixel section) 10a, in which a plurality of pixels including pixel electrodes is arranged in a matrix of the X direction and the Y direction, is provided in the center of the TFT array substrate 10. A pixel section (a second pixel section) 20a, in which a shielding layer is formed in the X direction and the Y direction so as to oppose the gaps between the pixel electrodes, is provided in the center of the opposite substrate 20. The outline of the pixel section 10a formed by the outline of the pixel electrodes located at the outermost part of the pixel section 10a has a rectangular shape having a longitudinal direction and a short direction. The outline of the pixel section 20a formed by the outline of the shielding layer located at the outermost part of the pixel section 20a has a rectangular shape having a longitudinal direction and a short direction.

The TFT array substrate 10 and the opposite substrate 21 each have a rectangular shape having a long side and a short side. The long side and the short side of the TFT array substrate 10 are arranged inclined with respect to the long side and the short side of the pixel section 10a at several degrees, respectively. The long side and the short side of the opposite substrate 21 are arranged inclined with respect to the long side and the short side of the pixel section 10a at several degrees, respectively. The long side and the short side of the opposite substrate 21 are arranged parallel to the long side and the short side of the pixel section 10a, respectively. The outline shapes of the pixel section 10a and the pixel section 20a generally conform with each other. The TFT array substrate 10 and the opposite substrate 21 are bonded with the pixel section 10a and the pixel sections 20a opposing each other.

An alignment layer 25 of the opposite substrate 21 is formed in the same manner as the alignment layer 15 of the TFT array substrate 10. That is, a plurality of second pixel sections 20a is arranged in a matrix of intersected straight lines of two directions on the oblique vapor deposition substrate with each pixel section being spaced apart from each other, allowing an oblique vapor deposition layer to be formed on the oblique vapor deposition substrate, and then, each of the plurality of second pixel sections 20a are separated by scribing along the boundary lines therebetween in the aforementioned two directions. In the oblique vapor deposition substrate for manufacturing the opposite substrates 21, the respective second pixel sections 20a have been relatively rotated in the plane of the oblique vapor deposition substrate taking into consideration the distribution of the vapor deposition directions in the oblique vapor deposition layer. Accordingly, the individual opposite substrates 21 which are separated from the oblique vapor deposition substrate are arranged so that the long side and the short side of the opposite substrate 21 are inclined with respect to the long side and the short side of the second pixel section 20a at several degrees.

A first dust proof substrate 401 is disposed on the side of the TFT array substrate 10 opposite to that on which the liquid crystal 50 is placed. A second dust proof substrate 403 is disposed on the side of the opposite substrate 21 opposite to that on which the liquid crystal 50 is placed. The first dust proof substrate 401 is formed of the same material and in the same size as the TFT array substrate 10 and arranged so as to superpose the TFT array substrate 10 in exactly the same shape as seen from the Z direction. The long side and the short side of the second dust proof substrate 403 are arranged parallel to the long side and the short side of the pixel sections 10a and 20a and the second dust proof substrate 403 is formed to be smaller than the opposite substrate 21.

Figure 17:
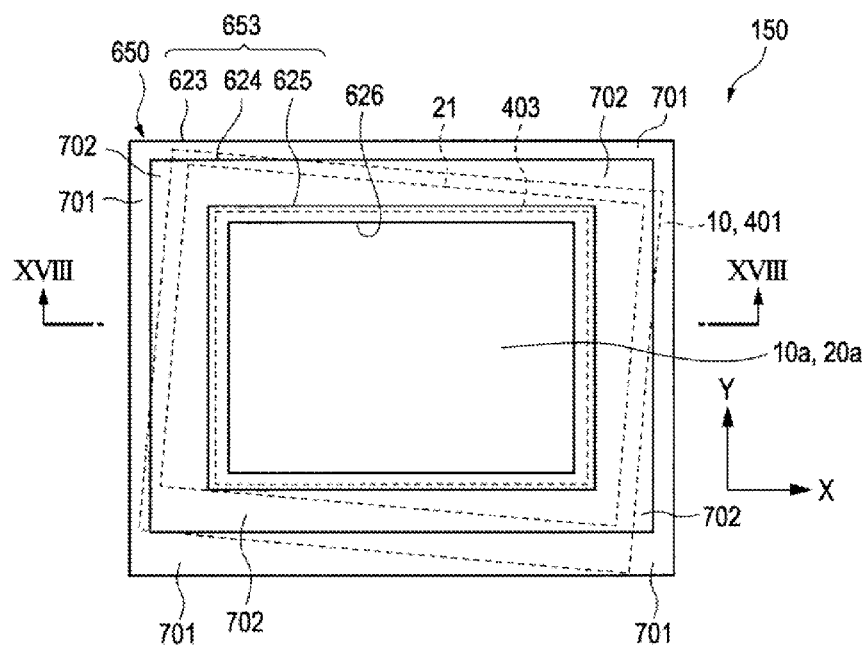
FIG. 17 is a view showing a positional relationship between a frame and the liquid crystal device.
Figure 18:
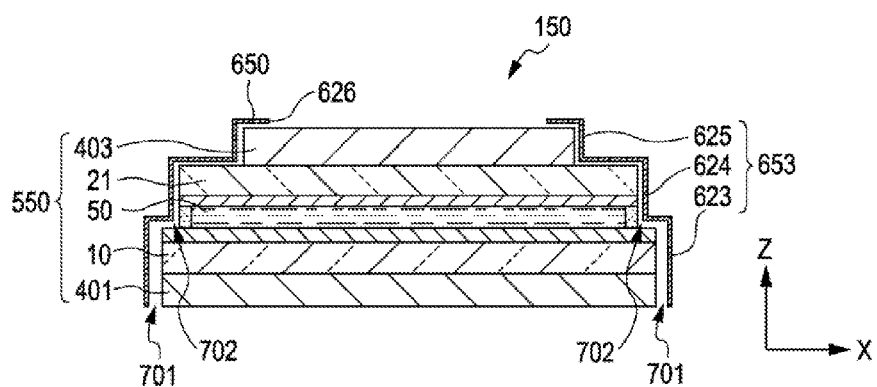
FIG. 18 is a sectional view taken along the line XVIII-XVIII of FIG. 17.

FIG. 17 is a view showing a positional relationship between a frame 650 and the liquid crystal device 550. FIG. 18 is a sectional view taken along the line XVIII-XVIII of FIG. 17. The frame 650 corresponds to the frame 610 of the first embodiment.

The frame 650 includes a body 653 that houses the liquid crystal device 550. The body 653 includes a first frame unit 623 that houses the TFT array substrate 10 and a first dust proof substrate 401, a second frame unit 624 that houses the opposite substrate 21 and a third frame unit 625 that houses the second dust proof substrate 403. The body 653 further includes a window 626 formed in the top surface of the third frame unit 625. The window 626 opposes the pixel sections 10a and 20a and is opened to allow light to pass therethrough into the pixel sections 10a and 20a of the liquid crystal device 550 housed in the body 653.

The long side and the short side of the first frame unit 623, the second frame unit 624 and the third frame unit 625 are arranged parallel to the long side and the short side, respectively, of the pixel sections 10a and 20a of the liquid crystal device 550. The long side and the short side of the second dust proof substrate 403 of the liquid crystal device 550 are arranged parallel to the long side and the short side, respectively, of the pixel sections 10a and 20a, while the long side and the short side of the TFT array substrate 10, the opposite substrate 21 and the first dust proof substrate 401 of the liquid crystal device 550 are arranged inclined with respect to the long side and the short side, respectively, of the pixel sections 10a and 20a.

The first frame unit 623 is formed to be larger than the TFT array substrate 10 and the first dust proof substrate 401 such that a gap 701 is formed between a side of the first frame unit 623 and a side of each of the TFT array substrate 10 and the first dust proof substrate 401. The second frame unit 624 is formed to be larger than the opposite substrate 21 such that a gap 702 is formed between a side of the second frame unit 624 and a side of the opposite substrate 21. The third frame unit 625 is formed to be substantially the same shape and size as the second dust proof substrate 403 such that little gap is formed between a side of the third frame unit 625 and a side of the second dust proof substrate 403. The third frame unit 625 has a recess so as to allow the opposite substrate 20 and the second dust proof substrate 403 to be snugly fit within the recess. The liquid crystal device 550 is secured to the frame 650 by fitting the second dust proof substrate 403 into the third frame unit 625. Accordingly, the positioning between the pixel sections 10a and 20a and the window 626 is achieved.

Liquid Crystal Device-3

Figure 19:
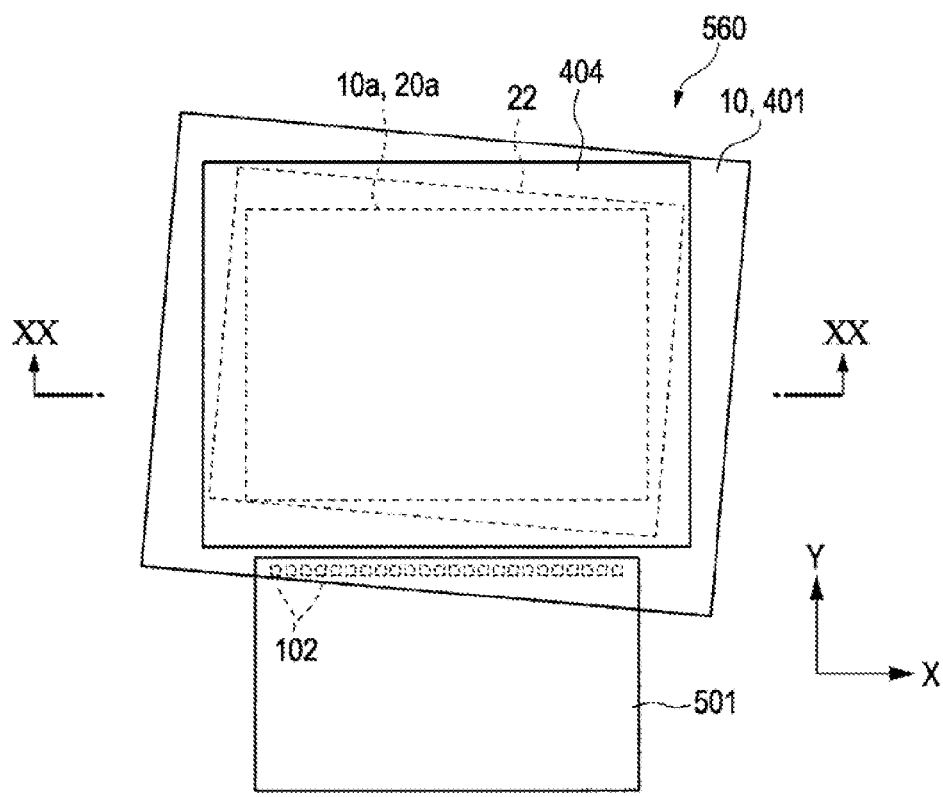
FIG. 19 is a plan view of a liquid crystal device with a TFT array substrate according to a third embodiment.
Figure 20:
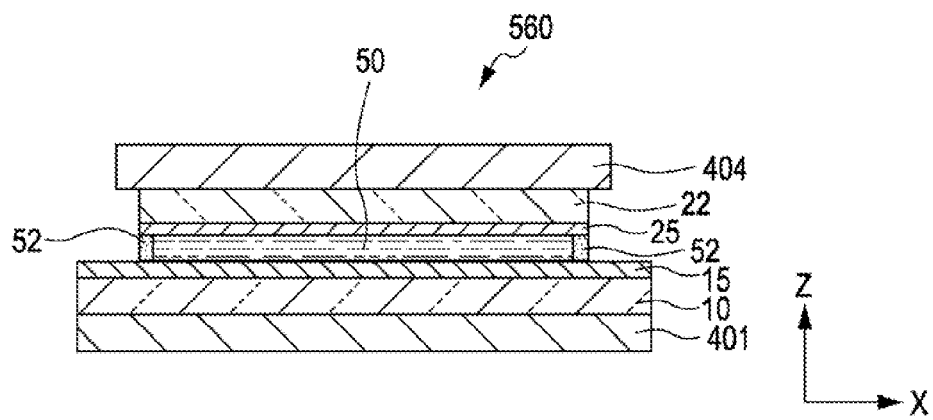
FIG. 20 is a sectional view taken along the line XX-XX of FIG. 19.

FIG. 19 is a plan view of a liquid crystal device with a TFT array substrate 10 according to a third embodiment. FIG. 20 is a sectional view taken along the line XX-XX of FIG. 19. In a liquid crystal device 560 of this embodiment, the same reference numerals are used for the same configuration as that of the liquid crystal device 500 of the first embodiment in order to avoid duplicated explanation.

A liquid crystal device 560 includes the TFT array substrate 10 and the opposite substrate 22 which are arranged so as to oppose each other. A pixel section (a first pixel section) 10a, in which a plurality of pixels including pixel electrodes is arranged in a matrix of the X direction and the Y direction, is provided in the center of the TFT array substrate 10. A pixel section (a second pixel section) 20a, in which a shielding layer is formed in the X direction and the Y direction so as to oppose the gaps between the pixel electrodes, is provided in the center of the opposite substrate 22. The outline of the pixel section 10a formed by the outline of a plurality of pixel electrodes located at the outermost part of the pixel section 10a has a rectangular shape having a longitudinal direction and a short direction. The outline of the pixel section 20a formed by the outline of the shielding layer located at the outermost part of the pixel section 20a has a rectangular shape having a longitudinal direction and a short direction.

The TFT array substrate 10 and the opposite substrate 22 each have a rectangular shape having a long side and a short side. The long side and the short side of the TFT array substrate 10 are arranged inclined with respect to the long side and the short side of the pixel section 10a at several degrees, respectively. The long side and the short side of the opposite substrate 22 are arranged inclined with respect to the long side and the short side of the pixel section 10a at several degrees, respectively. The long side and the short side of the TFT array substrate 10 are arranged parallel to the long side and the short side of opposite substrate 22, respectively. The outline shapes of the pixel section 10a and the pixel section 20a generally conform with each other. The TFT array substrate 10 and the opposite substrate 22 are bonded with the pixel section 10a and the pixel sections 20a opposing each other.

An alignment layer 25 of the opposite substrate 22 is formed in the same manner as the alignment layer 15 of the TFT array substrate 10. That is, a plurality of second pixel sections 20a is arranged in a matrix of intersected straight lines of two directions on the oblique vapor deposition substrate with each pixel section being spaced apart from each other, allowing an oblique vapor deposition layer to be formed on the oblique vapor deposition substrate, and then, each of the plurality of second pixel sections 20a are separated by scribing along the boundary lines therebetween in the aforementioned two directions. In the oblique vapor deposition substrate for manufacturing the opposite substrates 22, the respective second pixel sections 20a have been relatively rotated in the plane of the oblique vapor deposition substrate taking into consideration the distribution of the vapor deposition directions in the oblique vapor deposition layer. Accordingly, the individual opposite substrates 22 which are separated from the oblique vapor deposition substrate are arranged so that the long side and the short side of the opposite substrate 22 are inclined with respect to the long side and the short side of the second pixel section 20a at several degrees.

A first dust proof substrate 401 is disposed on the side of the TFT array substrate 10 opposite to that on which the liquid crystal 50 is placed. A second dust proof substrate 404 is disposed on the side of the opposite substrate 22 opposite to that on which the liquid crystal 50 is placed. The first dust proof substrate 401 is formed of the same material and in the same size as the TFT array substrate 10 and arranged so as to superpose the TFT array substrate 10 in exactly the same shape as seen from the Z direction. The long side and the short side of the second dust proof substrate 404 are arranged parallel to the long side and the short side of the pixel sections 10a and 20a and the second dust proof substrate 404 is formed to be larger than the opposite substrate 22.

Figure 21:
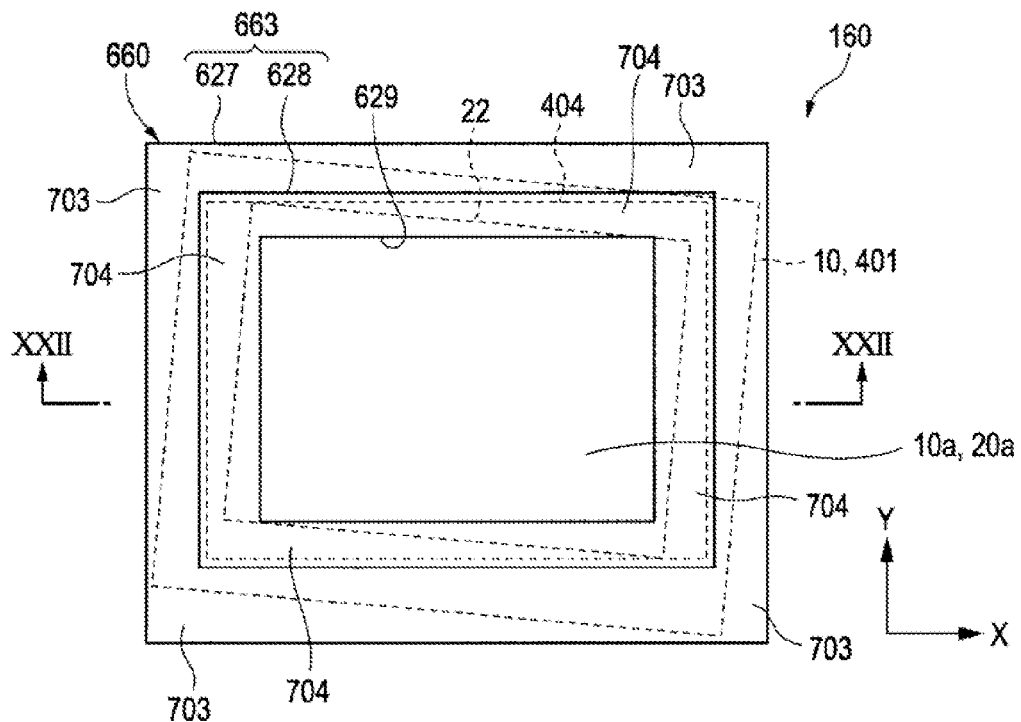
FIG. 21 is a plan view showing a positional relationship between a frame and the liquid crystal device.
Figure 22:
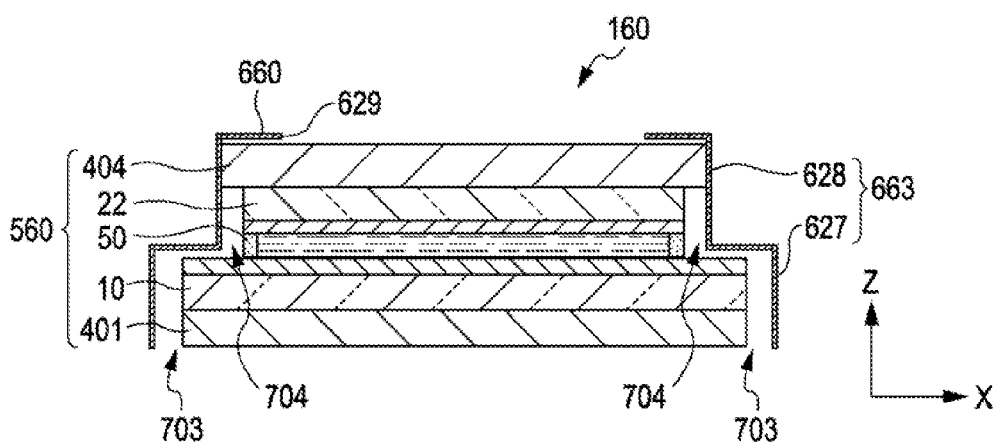
FIG. 22 is a sectional view taken along the line XXII-XXII of FIG. 21.

FIG. 21 is a plan view showing a positional relationship between a frame 660 and the liquid crystal device 560. FIG. 22 is a sectional view taken along the line XXII-XXII of FIG. 21. The frame 660 corresponds to the frame 610 of the first embodiment.

The frame 660 includes a body 663 that houses the liquid crystal device 560. The body 663 includes a first frame unit 627 that houses the TFT array substrate 10 and a first dust proof substrate 401, a second frame unit 628 that houses the opposite substrate 22 and the second dust proof substrate 404. The body 663 further includes a window 629 formed in the top surface of the second frame unit 628. The window 629 opposes the pixel sections 10a and 20a and is opened to allow light to pass therethrough into the pixel sections 10a and 20a of the liquid crystal device 560 housed in the body 663.

The long side and the short side of the first frame unit 627 and the second frame unit 628 are arranged parallel to the long side and the short side, respectively, of the pixel sections 10a and 20a of the liquid crystal device 560. The long side and the short side of the second dust proof substrate 404 of the liquid crystal device 560 are arranged parallel to the long side and the short side, respectively, of the pixel sections 10a and 20a, while the long side and the short side of the TFT array substrate 10, the opposite substrate 22 and the first dust proof substrate 401 of the liquid crystal device 560 are arranged inclined with respect to the long side and the short side, respectively, of the pixel sections 10a and 20a.

The first frame unit 627 is formed to be larger than the TFT array substrate 10 and the first dust proof substrate 401 such that a gap 703 is formed between a side of the first frame unit 627 and a side of each of the TFT array substrate 10 and the first dust proof substrate 401. The second frame unit 628 is formed to be larger than the opposite substrate 22 such that a gap 704 is formed between a side of the second frame unit 628 and a side of the opposite substrate 22. The second frame unit 628 is formed to be substantially the same shape and size as the second dust proof substrate 404 such that little gap is formed between a side of the second frame unit 628 and a side of the second dust proof substrate 404. The second frame unit 628 has a recess so as to allow the second dust proof substrate 404 to be snugly fit within the recess. The liquid crystal device 560 is secured to the frame 660 by fitting the second dust proof substrate 404 into the second frame unit 628. Accordingly, the positioning between the pixel sections 10a and 20a and the window 629 is achieved.

Electronic Device

Figure 23:
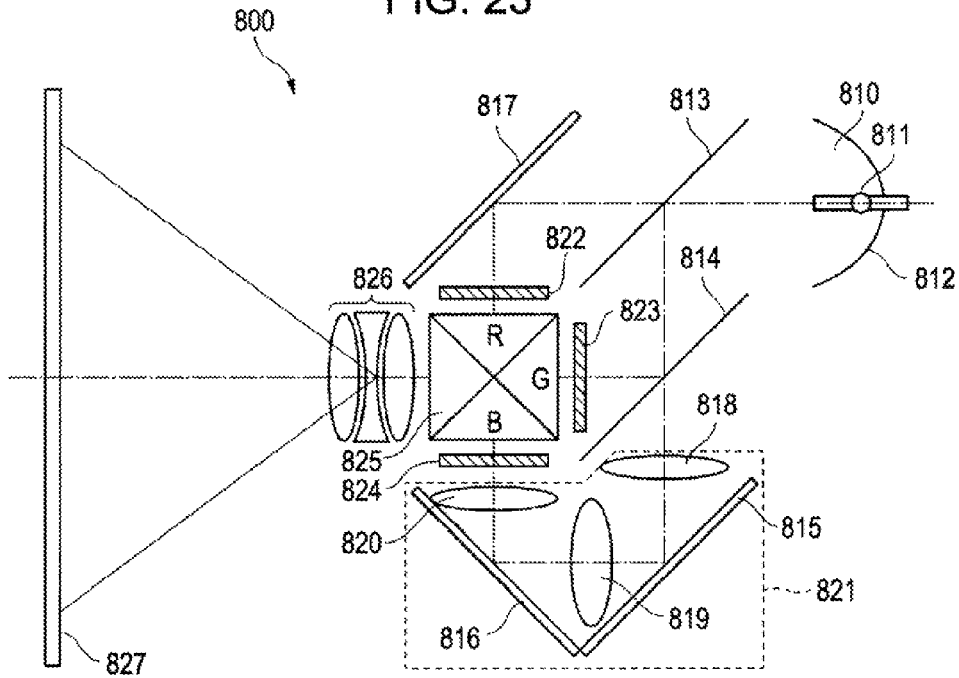
FIG. 23 is a schematic configuration view of a projection display device as one embodiment of an electronic device.

FIG. 23 is a schematic configuration view of a projection display device (liquid crystal projector) as one embodiment of an electronic device. A projection display device 800 uses a transmissive liquid crystal light valve described above in Liquid crystal device-1 to Liquid crystal device-3 as light modulation means.

Reference numerals 810 denotes a light source, 813 and 814 denote dichroic mirrors, 815, 816 and 817 denote reflective mirrors, 818 denotes an incident lens, 819 denotes a relay lens, 820 denotes an outgoing lens, 822, 823 and 824 denote light modulation means, 825 denotes a cross dichroic prism and 826 denotes a projection lens. The light source 810 is composed of a lamp 811 such as a metal halide lamp and a reflector 812 that reflects light from the lamp.

The dichroic mirror 813 passes red color light and reflects blue color light and green color light included in the white color light from the light source 810. The red color light passed through the dichroic mirror 813 is reflected by the reflective mirror 817 and incident into a red color light modulation means 822. The green color light reflected by the dichroic mirror 813 is reflected by the dichroic mirror 814 and incident into a green color light modulation means 823. Further, the blue color light reflected by the dichroic mirror 813 passes through the dichroic mirror 814. A light guide means 821 composed of a relay lens system including the incident lens 818, the relay lens 819 and the outgoing lens 820 is arranged so as to prevent a light loss of the blue color light due to a long path of the light. The blue color light is incident into a blue color light modulation means 824 via the light guide means 821. In the light modulation means 822, 823 and 824, a transmissive liquid crystal light valve described above in Liquid crystal device-1 to Liquid crystal device-3.

The three color light modulated by the respective light modulation means are incident into the cross dichroic prism 825. The cross dichroic prism 825 is composed of four right-angle prisms bonded to each other such that a dielectric multilayer that reflects red color light and a dielectric multilayer that reflects blue color light are arranged in a X shape at the interfaces of the prisms. The three color light are synthesized by these dielectric multilayers into light that forms a color image. The synthesized light is projected on a screen 827 by means of the projection lens 826, which is a projection optical system, so that an image is enlarged and displayed on the screen 827.

Variations

The preferred embodiments of the invention have been described with referring to the attached drawings. However, as a matter of course, the invention is not intended to be limited to the above embodiments. The configurations and combinations of the components described in the above embodiments are exemplary and may be modified in various manners depending on the design requirements and the like without departing from the principle of the invention.

For example, in Liquid crystal device-1 to Liquid crystal device-3, the panel area 10 which is shown in FIG. 8 is used as a TFT array substrate for a transmissive liquid crystal light valve. However, the panel area 10 of FIG. 8 may be used as a TFT array substrate for a reflective liquid crystal light valve. A reflective liquid crystal light valve is provided to reflect light incident from the side of an opposite substrate by the TFT array substrate so as to emit light from the opposite substrate.

Figure 24:
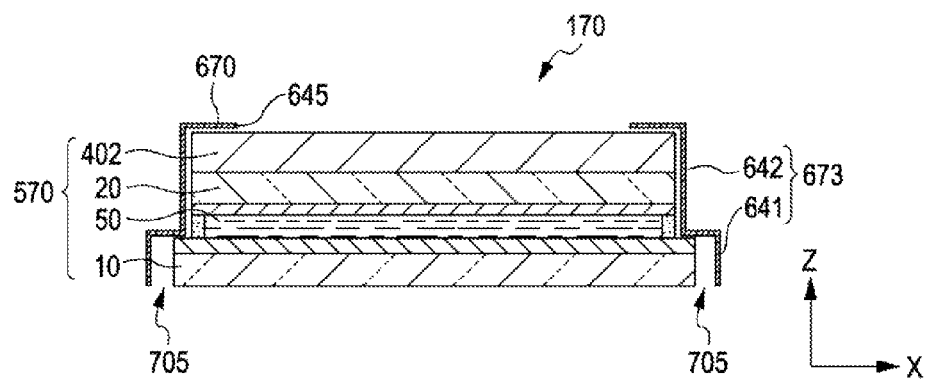
FIG. 24 is a sectional view of an alternative embodiment.

FIG. 24 is a sectional view of a panel area 10 of FIG. 8 which is used as a TFT array substrate 10 of a reflective liquid crystal light valve 170. FIG. 24 corresponds to FIG. 14 of the first embodiment. In FIG. 24, the same reference numerals are used for the same configuration as that of the first embodiment.

A liquid crystal device 570 includes the TFT array substrate 10 and an opposite substrate 20 which are arranged so as to oppose each other. The liquid crystal device 570 is a reflective liquid crystal device and the TFT array substrate 10 is formed of an opaque substrate such as a monocrystalline substrate or a light transmissive substrate such as a glass substrate on the surface of which a reflective layer such as Al and Ag is formed. The reflective layer may be formed under the pixel electrode, or alternatively, the pixel electrode may be made of Al, Ag or the like so as to serve as a reflective layer. The liquid crystal device 570 is the same as the liquid crystal device 500 of the first embodiment except for a reflective layer being arranged on the TFT array substrate 10 and the first dust proof substrate 401 being not arranged on the back side of the TFT array substrate 10.

A mounting case of the liquid crystal device 570 differs from the mounting case 601 of the first embodiment in that a first frame unit 641 has a size capable of housing the TFT array substrate 10. A frame 670 of the mounting case includes a body 673 that houses the liquid crystal device 570. The body 673 includes a first frame unit 641 that houses the TFT array substrate 10 and a second frame unit 642 that houses a opposite substrate 20 and a second dust proof substrate 402. The body 673 includes a window 645 formed in the top surface of the second frame unit 642. The window 645 opposes the pixel sections and is opened to allow light to pass therethrough into the pixel sections of the liquid crystal device 570 housed in the body 673. Although the mounting case is provided with a cover member, which is not shown, for covering the frame 670, the cover member is not provided with the window 632 such as that shown in FIG. 11.

The first frame unit 641 is formed to be larger than the TFT array substrate 10 such that a gap 705 is formed between a side of the first frame unit 641 and a side of the TFT array substrate 10. The second frame unit 642 is formed to be substantially the same shape and size as the opposite substrate 20 and the second dust proof substrate 402 such that little gap is formed between a side of the second frame unit 642 and a side of each of the opposite substrate 20 and the second dust proof substrate 402. The second frame unit 642 has a recess so as to allow the opposite substrate 20 and the second dust proof substrate 402 to be snugly fit within the recess. The liquid crystal device 570 is secured to the frame 670 by fitting the opposite substrate 20 and the second dust proof substrate 402 into the second frame unit 642. Accordingly, the positioning between the pixel sections of the TFT array substrate 10 and the opposite substrate 20 and the window 645 is achieved.

Although Liquid crystal device-1 is applied to the reflective liquid crystal light valve in FIG. 24 by partly modifying the configuration, Liquid crystal device-2 and Liquid crystal device-3 can also be applied to a reflective liquid crystal light valve by altering the design in a similar manner. Liquid crystal device-2 and Liquid crystal device-3 can be applied to a reflective liquid crystal light valve by providing a reflective layer on the TFT array substrate 10, eliminating the first dust proof substrate 401 on the back side of the TFT array substrate 10 and providing a first frame unit having a size capable of housing the TFT array substrate 10.

The above described liquid crystal devices is not limited to light modulation means for a projection display device, and can be advantageously used as image display means for the devices such as a liquid crystal television, a head mount display, a head-up display, an electronic book, a personal computer, a digital still camera, a video recorder of a view finder type or a direct monitor view type, a car navigation device, a pager, an electronic organizer, an electronic calculator, a word processor, a work station, a videophone, a POS terminal and a tough-panel device.

The entire disclosure of Japanese Patent Application No. 2010-084902, filed Apr. 1, 2010 is expressly incorporated by reference herein.

What is claimed is:

1. An oblique vapor deposition substrate comprising:
a first substrate that includes a plurality of pixel sections; and
an first oblique vapor deposition layer that is formed above the first substrate,
wherein
each pixel section has a plurality of pixels,
an outline of each pixel section has a rectangular shape and a center point that is an intersection point of the diagonal lines of the outline of each pixel section,
the plurality of pixel sections is disposed so as to arrange each center point of the respective pixel sections in a matrix of a first direction with a first distance and a second direction with a second distance, and
wherein
a first pixel section has a first side that is a long side of the respective outline,
the first side extends along a third direction,
a second pixel section has a second side that is a long side of the respective outline,
the second side extends along a fourth direction, and
the third direction intersects the fourth direction.

2. The oblique vapor deposition substrate according to claim 1, wherein the third direction intersects the first direction and the second direction.

3. The oblique vapor deposition substrate according to claim 2,
wherein
a third pixel section has a third side that is a long side of the respective outline,
the third side extends along a fifth direction, and
the fifth direction intersects the third direction and the fourth direction at a point.

4. The oblique vapor deposition substrate according to claim 3, wherein
the third direction intersects the first direction at a first angle, the third direction intersects the second direction at a second angle,
the second angle is smaller than the first angle, and
the first distance is smaller than the second distance.

* * * * *